(12) United States Patent
Nause et al.

(10) Patent No.: US 6,936,101 B2
(45) Date of Patent: Aug. 30, 2005

(54) SEMI-INSULATING BULK ZINC OXIDE SINGLE CRYSTAL

(75) Inventors: Jeff Nause, Mableton, GA (US); William Michael Nemeth, Atlanta, GA (US)

(73) Assignee: Cermet, Inc., Atlanta, GA (US)

( * ) Notice: Subject to any disclaimer, the term of this patent is extended or adjusted under 35 U.S.C. 154(b) by 93 days.

(21) Appl. No.: 10/602,185

(22) Filed: Jun. 23, 2003

(65) Prior Publication Data

US 2004/0055526 A1 Mar. 25, 2004

Related U.S. Application Data

(60) Provisional application No. 60/391,518, filed on Jun. 24, 2002.

(51) Int. Cl.[7] .............................................. C30B 11/02
(52) U.S. Cl. ........................................................ 117/81
(58) Field of Search ...................................... 117/81, 83

(56) References Cited

PUBLICATIONS

Y. Liu, C.R. Gorla, S. Liang, N. Emanetoglu, Y. Lu, H. Shen, and M. Wraback, "Ultravoilet Detectors Based On Epitaxial ZnO Films Grown by MOCVD," Journal of Electronic Materials, vol. 29, No. 1, 2000, May 11, 1999, pp. 69–74, Adelphi, Maryland.

M. Joseph, H. Tabata, H. Saeki, K. Ueda, T. Kawai, "Fabrication of the low–resistive p–type ZnO by codoping method," Physcia B 302–303 (2001) pp. 140–148, Osaka, Japan.

Jin–Bock Lee, Hye–Jung Lee, Soo–Hyung Seo, Jin–Seok Park, "Characterization of undoped and Cu–doped Zno Films for surface acoustic wave applications," Thin Solid Films 398–399 (2001) pp. 641–646, Ansan, South Korea.

V.A. Nikitenko, "Luminescence and EPR of Zinc Oxide (Review)," Moscow Institute of Railway Engineers, Moscow, Russia, vol. 57 Nos. 5–6 ppgs. 367–385, May 18, 1992.

*Primary Examiner*—Felisa Hiteshew
(74) *Attorney, Agent, or Firm*—Alston & Bird LLP

(57) ABSTRACT

A semi-insulating zinc-oxide (ZnO) single crystal. The crystal has resistivity of at least $1.5 \times 10^3$ ohm-centimeter ($\Omega$-cm). The ZnO crystal can be produced from a melt contained by solid-phase ZnO to prevent introduction of undesired impurities into the crystal. The crystal can be a bulk single crystal that is cut and processed into wafer form of specified thickness. A dopant in a concentration ranging from $1 \times 10^{15}$ atoms per cubic centimeter (atoms/cc) to $5 \times 10^{21}$ atoms/cc can increase resistivity of the crystal relative to intrinsic ZnO. The dopant can be lithium (Li), sodium (Na), copper (Cu), nitrogen (N), phosphorus (P), and/or manganese (Mn).

14 Claims, 1 Drawing Sheet

SEMI-INSULATING BULK ZINC OXIDE SINGLE CRYSTAL

CROSS-REFERENCE TO RELATED APPLICATION

This patent application is a U.S. nonprovisional application filed pursuant to Title 35, United States Code §§100 et seq. and 37 C.F.R. Section 1.53(b) claiming priority under Title 35, United States Code §119(e) to U.S. provisional application No. 60/391,518 filed Jun. 24, 2002 naming as inventors Jeffrey E. Nause and William M. Nemeth as inventors. Both the subject application and its provisional application have been or are under obligation to be assigned to the same entity.

BACKGROUND OF THE INVENTION

1. Field of the Invention

This invention relates to semi-insulating zinc oxide (ZnO) single crystals. Such crystals can be used as substrates upon which electronic, electro-optic, and/or opto-electronic devices and circuits can be formed.

2. Description of the Related Art

Compound semiconductor single crystals are being used to fabricate various devices such as high electron mobility (HEMT) devices, field effect transistors (FETs), and light emitting diodes (LEDs). These devices are manufactured by depositing several layers of various materials on an initial substrate. Examples of commonly used compound semiconductor substrates are indium phosphide (InP), gallium arsenide (GaAs), and silicon carbide (SiC). Recently, there has been a spike of interest in zinc oxide (ZnO) single crystals for use as a substrate due to its wide band gap (3.3 eV), its stability at device operating temperatures (exciton binding energy of 60 MeV), and its close lattice spacing with gallium nitride (GaN) (there is only a 3% mismatch in lattice spacing between ZnO and GaN).

A semi-insulating substrate is preferred for device fabrication to effectively limit leakage current, thereby isolating individual components of the deposited device. The resistivity value of a semi-insulating material has come into question, and the general definition set forth by Carter et al. U.S. Pat. No. 6,218,680 will be followed, where a semi-insulating material must meet the minimum requirement of $1.5 \times 10^3$ Ω-cm at room temperature. Johnston et al. U.S. Pat. No. 6,211,539 have claimed semi-insulating behavior in InP for resistivity values as high as $1 \times 10^9$ Ω-cm, so this value will be accepted as the maximum semi-insulator resistivity value. It is of interest to note that Bylsma et al., U.S. Pat. No. 4,77,146, claim that resistivity less than $10 \times 10^6$ Ω-cm will exhibit excessive leakage current for GaAs, whereas Carter et al. similarly claim that for device isolation in SiC the resistivity value must be at least 533 $10^4$ Ω-cm. This reveals the variation in material electrical properties that will achieve true device isolation, where parasitic currents are avoided.

It has been found that ZnO exhibits semi-insulating behavior when a dopant is introduced into the crystal structure. Liu et al. grew Li doped ZnO films with resistivities ranging from $10^6$ Ω-cm to $10^{11}$ Ω-cm. The applicant, Cermet, Inc., has grown Li-doped ZnO crystal with a measured resistivity of $2 \times 10^8$ Ω-cm. Nikitenko describes ZnO single crystals with Li additions yielding a resistivity of $10^4$ Ω-cm. Liu et al. also grew N-doped ZnO films measuring $10^6$ Ω-cm, while Joseph et al. grew $10^5$ Ω-cm N-doped films. Lee et al. grew highly resistive ($10^{10}$ Ω-cm). Cu-doped films, and Han et al. produced Mn-doped pellets of ZnO with resistivity of $10^8$ Ω-cm, whereas undoped ZnO pellets yield a resistivity of 10 Ω-cm.

SUMMARY OF THE INVENTION

The invention is a semi-insulating zinc oxide (ZnO) bulk single crystal grown with dopants added and processed into a wafer form. The dopants used can be found in Group IA (Li, Na), Group 1B (Cu), Group 5 (N, P) as well as Group 7B (Mn), ranging in concentration from $10^{15}$ to $10^{20}$ atoms per cubic centimeter (atoms/cc). The lowest resistivity that ZnO will still exhibit semi-insulating behavior is $1.5 \times 10^3$ Ω-cm at room temperature, so appropriate dopant concentrations must be effective to achieve at least this resistivity. Increasing the ZnO resistivity can be tailored due to the general trend of increasing dopant concentration with increasing resistivity. This is due to the fact that the additions are acceptors.

ZnO is highly susceptible to two defects, zinc interstitials and oxygen vacancies. Both act as electron donors and thus will decrease resistivity of the bulk crystal. When the overall number of unconfined electrons is lowered, the resistivity will rise. This can be accomplished in two ways. The first is perfecting the structure of the pure ZnO by removing the zinc interstitials and oxygen vacancies. By stoichiometrically bringing the ZnO structure into a refined state by adding more oxygen to the matrix, thereby removing zinc, the resistivity increases. This is highly difficult to accomplish due to the lower confining energy oxygen has in the ZnO matrix with respect to zinc. The second, more easily attainable way to achieve higher resistivity is by adding dopants that act as acceptors of electrons, which subsequently lowers the number of free electrons.

A method for forming a ZnO crystal as described above is also disclosed. The method can comprise forming the ZnO crystal from a melt. During crystal growth, the melt can be contained within solid-phase ZnO so that the ZnO crystal has the purity and composition required to obtain electrical isolation of any device formed thereon.

Additional objects and advantages of the invention are set forth in the description which follows. The objects and advantages of the invention may be realized and obtained by means of the instrumentalities and combinations particularly pointed out in the appended claims.

BRIEF DESCRIPTION OF THE DRAWINGS

The accompanying drawings, which are incorporated herein and constitute a part of the specification, illustrate presently preferred embodiments of the invention, and together with the general description given above and the detailed description of the preferred embodiments given below, serve to explain the principles of the invention.

The invention is now described with reference to the accompanying drawings which constitute a part of this disclosure. In the drawings, like numerals are used to refer to like elements throughout the several views.

DETAILED DESCRIPTION OF THE PREFERRED EMBODIMENTS

Figure 1:
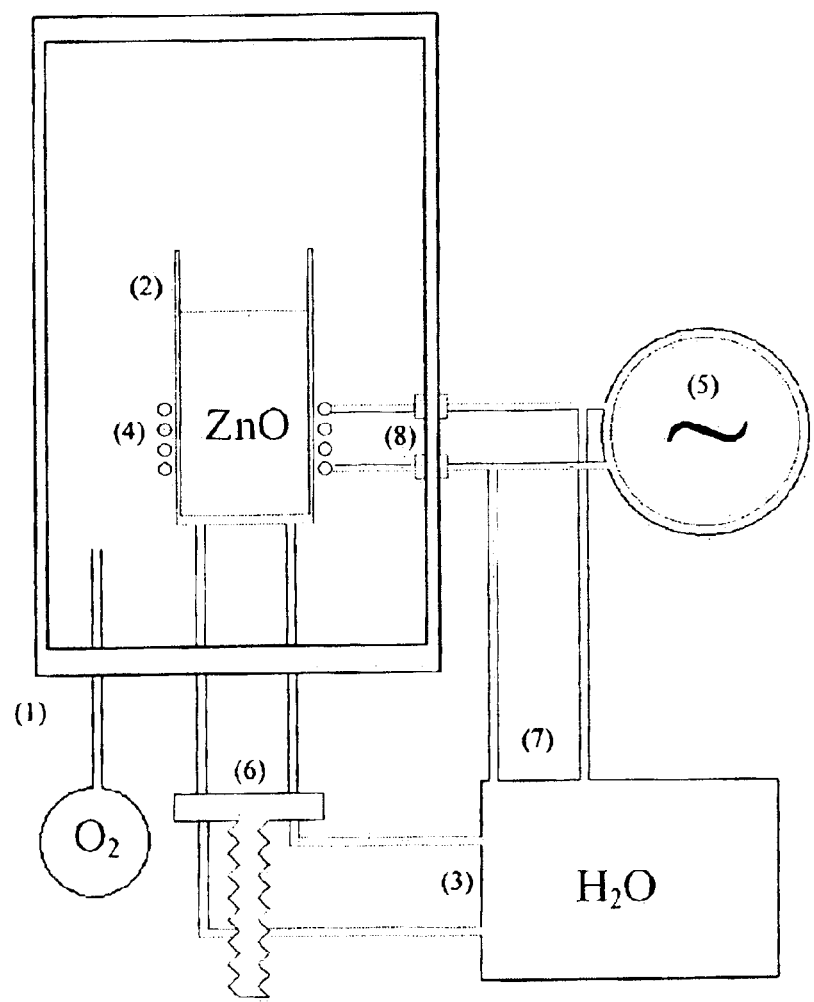
FIG. 1 is a diagram of the modified Bridgeman growth apparatus which can be used to form a semi-insulating zinc oxide (ZnO) single crystal in accordance with the invention.

The crystal growth apparatus, shown in FIG. 1, utilizes a modified Bridgeman growth technique including a pressure vessel that contains pressurized oxygen from a source (1).

This apparatus is further disclosed in U.S. Pat. No. 5,900,060 issued May 4, 1999 to Jeffrey E. Nause et al., which is incorporated by reference herein as if set forth in full hereinafter. The apparatus also includes a cooling unit (2) that is situated in the pressure vessel. The cooling unit receives a coolant flow from outside of the vessel (3) and has cooled surfaces that define an enclosure, which receives the ZnO with proper dopant concentration ($10^{15-1020}$ atoms/cc).

The apparatus further includes an inductive heating element (4) situated in the vessel, which is coupled to receive radio-frequency (rf) power externally to the vessel (5). A seed crystal of appropriate orientation can be placed inside the cooling unit (2). A precursor containing a stoichiometric quantity of ZnO, optionally including a resistivity-increasing dopant, is placed inside the cooling unit (2). The element heats the interior portion of the doped ZnO to form a molten interior portion contained by a relatively cool, exterior solid-phase portion of the doped ZnO that is closer relative to the molten interior, to the cooled surfaces of the cooling unit. A gaseous resistivity-raising dopant may be added through a conduit (not shown) extending from a dopant source into the interior of vessel (3). The dopant can comprise atoms from one or more of Group 1A (Li, Na), Group 1B (Cu), Group 5 (N, P) as well as Group 7B (Mn) of the periodic table of elements. Those of ordinary skill in the art well understand how to use this and other components and techniques to introduce a dopant into the vessel (3) for incorporation in the lattice of the ZnO crystal to be grown. Due to the pressure exerted by the gas contained in the vessel, the liquid interior of the doped ZnO becomes congruently melting to prevent its decomposition. The cooling unit is then lowered through element (6) to produce crystal nucleation at the base of the cooling unit and preferential crystal growth through the distance traveled.

In addition to rf power, the heating element receives a coolant flow (7) from a feedthrough that extends through a wall of the pressure vessel. In proximity to the vessel wall, the feedthrough has two coaxial conductors (8) to improve the electric power transfer to the heating element and to reduce heating of the external surfaces of the vessel. The two conductors of the feedthrough are cylindrical in shape, and define two channels for channeling a coolant flow to and from, respectively, the heating element.

After the growth process, the ZnO crystal is extracted from the cooling unit (2). The ZnO crystal is cut into wafer form, and processed by polishing and/or etchant to a predetermined or standard thickness. The ZnO wafer can then be used as a substrate for the formation of one or more integrated devices thereon. The resistivity of the ZnO wafer is at least $1.5 \times 10^3$ Ω-cm at room temperature to ensure proper electrical isolation of the device or devices formed thereon.

Although the methods of the invention have been described herein with reference to specific embodiments and examples, it is not necessarily intended to limit the scope of the invention to the specific embodiments and examples disclosed. Thus, in addition to claiming the subject matter literally defined in the appended claims, all modifications, alterations, and equivalents to which the applicant is entitled by law, are herein expressly reserved by the following claims.

What is claimed is:

1. A method comprising the step of:

forming a semi-insulating zinc-oxide (ZnO) single crystal using a modified Bridgeman growth technique in which the ZnO single crystal is formed from a ZnO melt contained within solid-phase ZnO.

2. The method of claim 1 wherein the crystal is formed with a resistivity in a range from $1.5 \times 10^3$ to $10^9$ ohm-centimeter (Ω-cm).

3. The method of claim 1 wherein the crystal is formed with a resistivity sufficient to achieve electrical isolation of a device to be formed thereon.

4. The method of claim 1 wherein the crystal is formed from a melt.

5. The method in claim 1 wherein the crystal is formed as a substrate that is grown as a bulk single crystal, cut, and processed to a specified thickness.

6. The method in claim 1 wherein the crystal is formed with a dopant that increases the resistivity of the crystal relative to intrinsic ZnO.

7. The method of claim 6 wherein the dopant is added to the ZnO single crystal in an atomic concentration ranging from $1 \times 10^{15}$ atoms per cubic centimeter (atoms/cc) to $5 \times 10^{21}$ atoms/cc.

8. The method of claim 6 wherein the dopant comprises lithium (Li).

9. The method of claim 6 wherein the dopant comprises sodium (Na).

10. The method of claim 6 wherein the dopant comprises copper (Cu).

11. The method of claim 6 wherein the dopant comprises nitrogen (N).

12. The method of claim 6 wherein the dopant comprises phosphorus (P).

13. The method in claim 6 wherein the dopant comprises manganese (Mn).

14. A method comprising the step of:

forming a semi-insulating zinc-oxide (ZnO) single crystal using a modified Bridgeman growth technique in which a melt of ZnO is formed with a heating element and is contained within a solid phase portion of ZnO cooled by a cooling unit and in which the ZnO is pressurized with oxygen (O) from a source, to form the ZnO single crystal.

* * * * *

(12) EX PARTE REEXAMINATION CERTIFICATE (5698th)
United States Patent
Nause et al.

(10) Number: US 6,936,101 C1
(45) Certificate Issued: Mar. 6, 2007

(54) SEMI-INSULATING BULK ZINC OXIDE SINGLE CRYSTAL

(75) Inventors: Jeff Nause, Mableton, GA (US); William Michael Nemeth, Atlanta, GA (US)

(73) Assignee: Cermet, Inc., Atlanta, GA (US)

Reexamination Request:
No. 90/008,035, May 23, 2006

Reexamination Certificate for:
Patent No.: 6,936,101
Issued: Aug. 30, 2005
Appl. No.: 10/602,185
Filed: Jun. 23, 2003

Related U.S. Application Data

(60) Provisional application No. 60/391,518, filed on Jun. 24, 2002.

(51) Int. Cl.
*C30B 11/02* (2006.01)

(52) U.S. Cl. .......................................... 117/81; 117/83
(58) Field of Classification Search .................... 117/81, 117/83
See application file for complete search history.

(56) References Cited

U.S. PATENT DOCUMENTS

| 4,777,146 A | 10/1988 | Bylsma |
| 5,900,060 A | 5/1999 | Nause |
| 6,211,539 B1 | 4/2001 | Johnston |
| 6,218,680 B1 | 4/2001 | Carter |

OTHER PUBLICATIONS

Japing Han, P.Q. Mantas, and A.M.R. Senos, "Effect of Al and Mn doping on the electrical conductivity of ZnO", Journal of the European Ceramic Society, vol. 21, Issues 10–11, 2001 pp. 1883–1886.

*Primary Examiner*—Stephen Stein

(57) ABSTRACT

A semi-insulating zinc-oxide (ZnO) single crystal. The crystal has resistivity of at least $1.5 \times 10^3$ ohm-centmeter ($\Omega$-cm). The ZnO crystal can be produced from a melt contained by solid-phase ZnO to prevent introduction of undesired impurities into the crystal. The crystal can be a bulk single crystal that is cut and processed into wafer form of specified thickness. A dopant in a concentration ranging from $1 \times 10^{15}$ atoms per cubic centimeter (atoms/cc) to $5 \times 10^{21}$ atoms/cc can increase resistivity of the crystal relative to intrinsic ZnO. The dopant can be lithium (Li), sodium (Na), copper (Cu), nitrogen (N), phosphorus (P), and/or manganese (Mn).

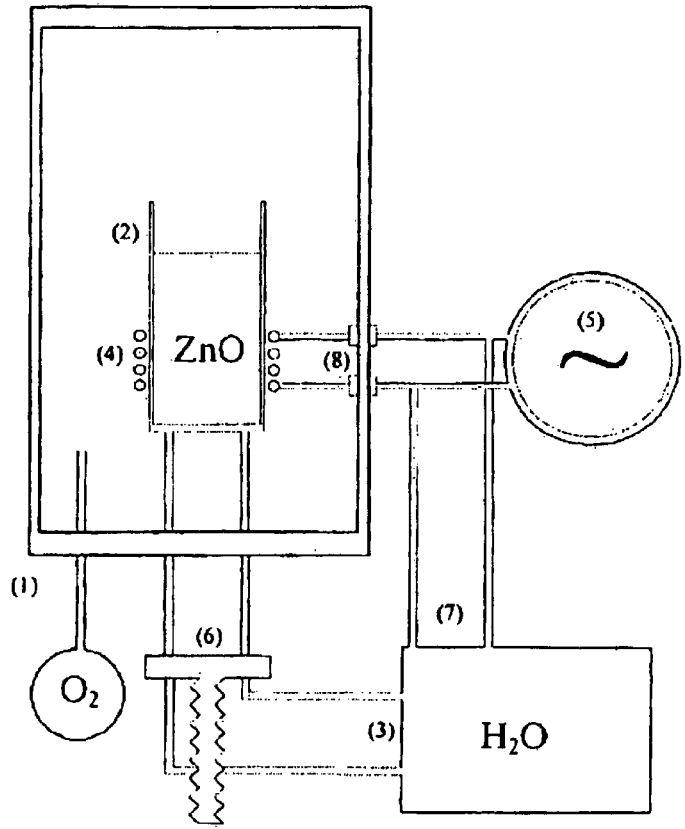

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–14 is confirmed.

* * * * *